United States Patent [19]

Arai

[11] Patent Number: 5,002,793

[45] Date of Patent: Mar. 26, 1991

[54] PROCESS FOR FORMING FILM IN A THREE-CHAMBERED APPARATUS HAVING TWO CHAMBER FACES COATED WITH FILMS OF AT LEAST $10^6 \Omega$ CM RESISTANCE

[75] Inventor: Takayoshi Arai, Nagahama, Japan

[73] Assignee: Canon Kabushiki Kaisha, Tokyo, Japan

[21] Appl. No.: 360,138

[22] Filed: May 31, 1989

[30] Foreign Application Priority Data

Jun. 2, 1988 [JP] Japan ................ 63-134430

[51] Int. Cl.$^5$ ............................................. B05D 3/06
[52] U.S. Cl. ................................. 427/38; 427/45.1;
118/626; 118/719; 118/725
[58] Field of Search ............ 427/38, 45.1; 118/719, 118/725, 620

[56] References Cited

U.S. PATENT DOCUMENTS

| | | | |
|---|---|---|---|
| 4,558,660 | 12/1985 | Nishizawa et al. | 219/411 |
| 4,689,093 | 8/1987 | Ishihara et al. | 427/45.1 |
| 4,702,934 | 10/1987 | Ishihara et al. | 118/719 |
| 4,849,249 | 7/1989 | Ishihara et al. | 118/719 |

FOREIGN PATENT DOCUMENTS 61-90425 5/1986 Japan ................ 427/38
62-218551 9/1987 Japan.

Primary Examiner—Stanley Silverman
Attorney, Agent, or Firm—Fitzpatrick, Cella, Harper & Scinto

[57] ABSTRACT

A process for the formation of a deposited functional film by separately introducing, into a film-deposition space (A) for forming a deposited film on a substrate, a precursor as the starting material for forming a deposited film which is formed by applying a microwave energy in to a precursor-generating gaseous raw material a decomposition space (B) and an active species which is formed in a decomposition space (C) and which is chemically reactive with the precursor, respectively and chemically reacting them to thereby form a deposited film on the substrate, wherein the inner wall face of a chamber constituting the film-deposition space (A) and the inner wall face of a chamber constituting the decomposition space (C) are coated with a thin film constituted with an element or ingredient constituting the deposited film having a resistance value of $10^6$ $\Omega$.cm or more, thereby preventing intrusion of impurities from inner wall material into the deposited film.

2 Claims, 6 Drawing Sheets

PROCESS FOR FORMING FILM IN A THREE-CHAMBERED APPARATUS HAVING TWO CHAMBER FACES COATED WITH FILMS OF AT LEAST $10^6 \Omega$ CM RESISTANCE

FIELD OF THE INVENTION

The present invention concerns a process for the formation of a functional deposited film of high quality useful for various types of semiconductor devices. More particularly, the present invention concerns a process for the formation of a functional deposited film using an apparatus comprising a microwave plasma generation chamber and a film-forming chamber, the inner wall face of each of which chambers being coated with a film of $10^6 \Omega$.cm or more.

BACKGROUND OF THE INVENTION

For the formation of amorphous silicon films, there have been attempts to use, for example, vacuum vapor deposition process, plasma CVD process, CVD process, reactive sputtering process, ion plating process or light CVD process, and among these processes, the plasma CVD process has been used generally and put to industrial application.

However, for the deposited films constituted with amorphous silicon, there has been room for the further improvement of overall characteristics in electrical and optical characteristics, wear characteristics upon repeated use, use environmental characteristics, as well as productivity and mass productivity including homogenity and reproducibility.

The reaction process in the formation of a deposited amorphous silicon film by using the plasma CVD process that has been put to generalized use is rather complicated as compared with the conventional CVD process, and there have still been several points left unclear in the reaction mechanisms. In addition, there are many parameters for the formation of the deposited film (for instance, substrate temperature, the flow rate and the ratio of gases introduced, inner pressure upon film formation, RF power, electrode structure, structure of reaction vessel, gas discharging rate, plasma generation system, etc.). Combination of these many parameters often renders plasmas instable and causes noticeable undesired effects on the deposited films formed. Moreover, parameters inherent to apparatus have to be selected on every apparatus and, accordingly, generalization for production conditions is difficult at present.

On the other hand, for attaining amorphous silicon films capable of sufficiently satisfying electrical and optical properties as the amorphous silicon films in each of the application uses, it is considered most preferred at present to form them by means of the plasma CVD process.

However, it is necessary to enable mass production with good reproducibility while completely satisfying the increase of area, homogenity of films and homogenity of film quality depending on the application uses of the deposited films. Accordingly, in the formation of a deposited amorphous silicon film by means of the plasma CVD process, an enormous installation cost is required for the mass production apparatus, the items for the administration of mass production thereof are too complicated to restrict the allowable range for the administration and the adjustment of the apparatus is delicate. These have been pointed out as problems to be solved.

As a method of eliminating the foregoing drawbacks in the plasma CVD process, Japanese Patent Laid-Open Sho 60-41047 has proposed a process for the formation of a deposited film on a substrate by separately introducing, into a film-deposition space (A) for forming the deposited film on the substrate, a precursor as the starting material for forming the deposited film which is formed in a decomposition space (B) and an active species which is formed in the decomposition space (C) and which reacts with the precursor respectively.

FIG. 5 schematically shows a typical example of an apparatus which is suitable to practicing the process for the formation of a deposited film.

In FIG. 5, 501 denotes a film-deposition chamber as a film-forming space, in which a deposited film-forming substrate 503 is placed on a substrate bed 502. There are also shown a heater 504 for heating the substrate, starting material gas supply sources 505 through 508 and 512, pressure controllers 505a through 508a and 512a for starting material gas, valves 505b or 505c through 508b or 508c and 512b or 512c for flowing respective gases and mass flow controllers 505d through 508d and 512d for adjusting the flow rate of each of the gases, gas introduction pipes 509 and 513 for respective starting material gases, a microwave source 510 for converting the starting material gas passing through the gas introduction pipe 509 into active species in the decomposition space (C), a waveguide 511 and an electric furnace 514 for converting the starting material gas passing through the gas introduction pipe 513 into a precursor in the decomposition space (B), an exhaustion valve 515, an exhaustion pipe 516 and a quartz pipe 521. The precursor formed in the decomposition space (B) and the active species formed in the decomposition space (C) are reacted with each other in the deposition space (A) for forming a deposited film, thereby forming a deposited film on the substrate 503.

According to the process for the formation of the deposited film, it is possible to easily attain the improvement for the productivity of the film and massproduction thereof while improving various properties, film-forming rate and reproducibility of the films to be formed and unifying the film qualitY, with suitability for increasing the area of the film.

However, when a deposited film is formed on the substrate by the above-mentioned process, the deposited film is deposited not only on the substrate 503 but also on the inner wall of the deposition chamber 501 and on the surface of the substrate support bed 502. Accordingly, it is usual to employ a method of removing the deposited film before transferring to the succeeding film formation by applying dry etching to the inside of the deposition chamber 501 using an appropriate etching gas, for example, a gas mixture of $CF_4$ and $O_2$. For instance, dry etching is carried out by a method like that for the formation of active species in the conventional deposited film forming apparatus shown in FIG. 5, introducing an appropriate amount of a gas mixture from a $CF_4/O_2$ gas mixture reservoir not illustrated into the deposition chamber 501, charging an appropriate amount of power from a microwave power source 510 and generating based on a gas mixture of $CF_4$ and $O_2$ mixed plasmas in the decomposition space (C).

However, the inner wall of the decomposition space (C) or the deposition chamber 501 may sometime be eroded in the dry etching, by F radicals formed, by which elements constituting the inner walls may be made free and adsorbed to the inner wall surface. Further, carbon atoms, oxygen atoms, etc. derived from $CF_4$ or $O_2$ may be adsorbed to the inner wall of the decomposition space (C) and the deposition chamber 501.

If the step is transferred to the succeeding filmforming under such conditions, carbon atoms or oxygen atoms adsorbed to the wall surface may be mixed as contaminates into the deposited film during film formation, to form an impurity level and remarkably reduce the properties of the deposited film.

In addition, when activation energy, for example, microwave is introduced into the decomposing space (C) for forming the active species, thereby forming plasmas, the inner wall of the decomposition space (C) is damaged by the plasmas and the inner wall constituent elements (for example, oxygen in the case where the decomposition space (C) is made of quartz ($SiO_2$ pipe) is made free, which may also be mixed into the deposited film thereby remarkably reducing the property thereof.

Accordingly, since carbon atoms, oxygen atoms, etc. will some time be mixed as contaminants into the film as has been described above, it is further necessary to make an improvement for the process for the formation of the deposited film in order to further satisfy productivity and mass productivity of the film while maintaining various properties of the deposited film.

SUMMARY OF THE INVENTION

The object of the present invention is to provide a process for the formation of a functional deposited film, by further improving the conventional deposited film formation process described above.

That is, the principal object of the present invention is to easily attain the simplification for the administration of film-forming conditions and mass production of the films while maintaining the properties of the films to be formed and improving the deposition rate without using plasma reactions in the depositing space for forming the deposited film.

The present invention has been accomplished as a result of extensive studies by the present inventor for improving the conventional process for the formation of a deposited film and for attaining the foregoing objects.

The feature of the present invention resides in a process for the formation of a deposited film by separately introducing into a film-deposition space (A) containing a substrate onto which a film is to be deposited, a precursor as the starting material for forming a deposited film which is formed in a decomposition space (B) and an active species which is formed in a decomposition space (C) and which reacts with the precursor and chemically reacting them in the film-deposition space to thereby form a deposited film on the substrate, wherein the inner wall face of each of which chambers is coated with a film with electrical resistance of $10^6 \Omega.cm$ or more and constituted with an element or ingredient for constituting the deposited film.

DESCRIPTION OF THE INVENTION

The present inventor has obtained the knowledge that a deposited film having desired properties can be formed by the process for the formation of a deposited film according to the present invention having the foregoing constitution based on the results of experiments described later.

Description is to be made for the experiments carried out by the present inventor.

EXPERIMENTS

Figure 1:
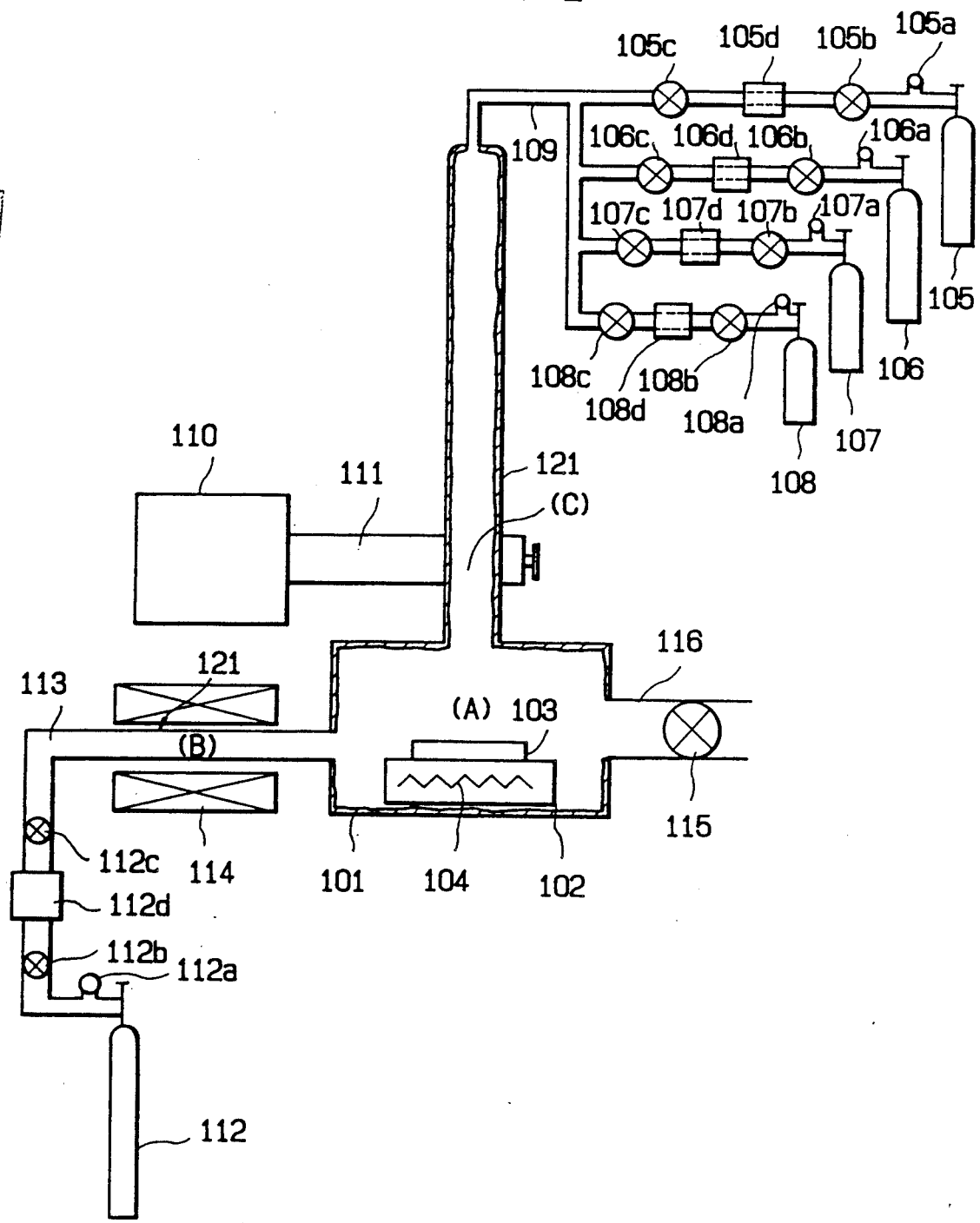
FIG. 1 is a schematic explanatory view for a typical film-forming apparatus suitable to practicing the process for the formation of a functional deposited film according to the present invention.

The inner wall face of the chamber constituting the film-deposition space (A) and the inner wall face of the chamber constituting the decomposition space (C) were coated respectively with non-doped A-Si (H,F) films while varying their resistance value in the same manner as in the method of using the apparatus shown in FIG. 1 in Example 1 described layer.

Figure 6:
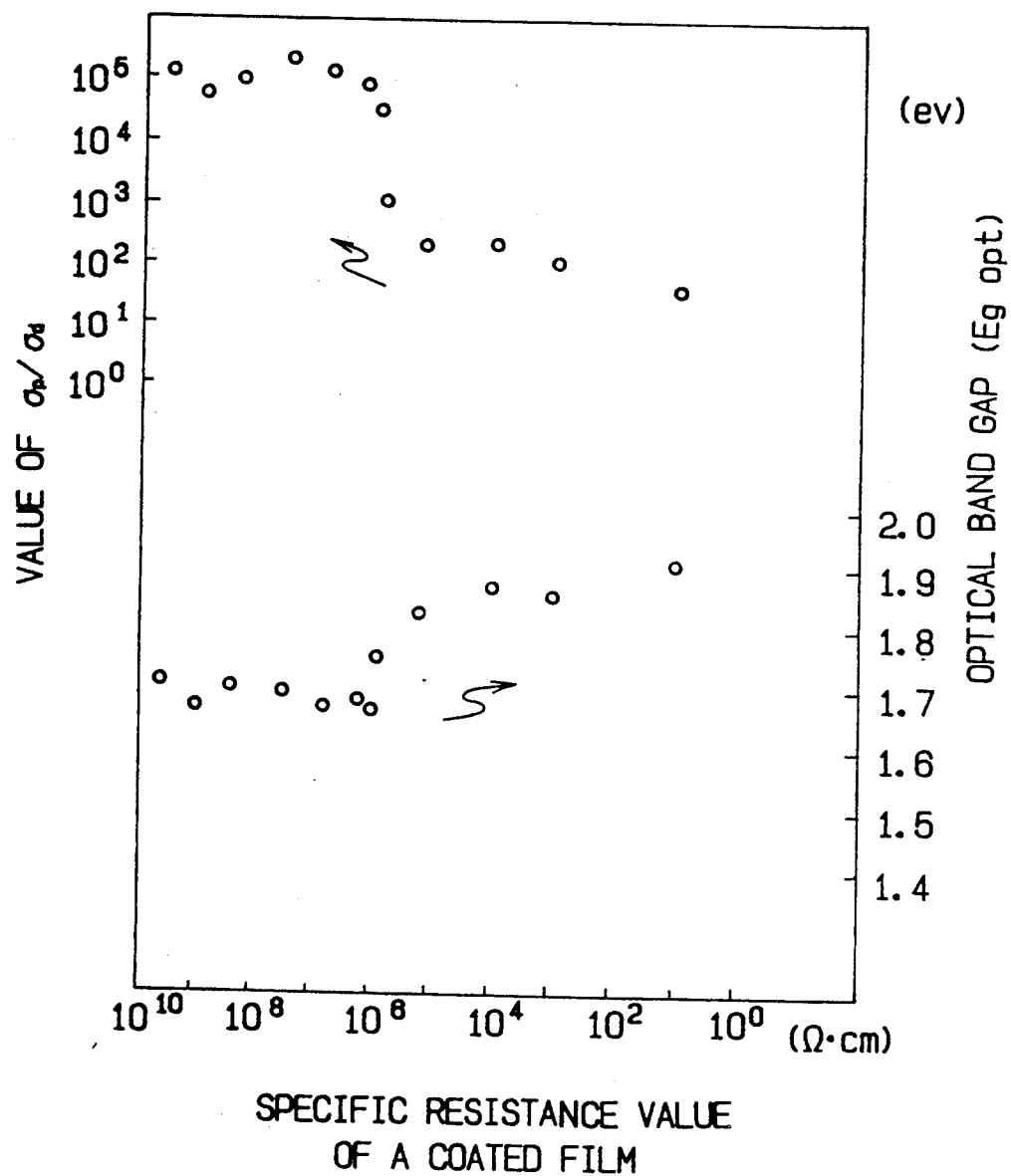
FIG. 6 is a view showing values for the ratio of photoconductivity to dark conductivity, as well as optical band gap of the film obtained by forming non-doped A-Si(H,F) films while varying the resistance value of the film with which the inner wall face is coated.

Then, a plurality of deposited films were formed on substrates under the same conditions as for the coated film. The value for the ratio of the photoconductivity ($\sigma p$) and the dark conductivity ($\sigma d$) and the optical band gap ($Eg^{opt}$) were examined for each of the resultant deposited films. The results obtained were as shown in FIG. 6.

The values for $\sigma p/\sigma d$ and $Eg^{opt}$ show the average values for the respective specimens obtained by preparing non-doped A-Si (H,F) films each for twenty times with the films having respective resistance values being coated. It can be seen from the results shown in FIG. 6 that a deposited film with a high $\sigma p/\sigma d$ value and with the value for $Eg^{opt}$ from 1.6 to 1.7 eV can be obtained by coating a film with the resistance value of $10^6 \Omega.cm$ or more to the inner wall face of the film-deposition space (A) and to the inner wall face of the decomposition space (C).

That is, by coating a film constituted with an element or ingredient which is a constituent of the deposited film to be formed and which has a resistance value of $10^6 \Omega.cm$ or more to the inner wall face of the film-deposition space (A) and the decomposition space (C), it becomes possible to prevent the intrusion of contaminants such as oxygen atoms derived from the material of the inner wall of the film-deposition space (A) and the decomposition space (C) into a deposited film to be formed. As a result, a desirable deposited film having an excellent optical property and electrical property can be obtained with better reproducibility as compared with that in the conventional process.

Further, when the film-deposition space (A) or the decomposition space (C) is constituted with a metal material such as aluminum or stainless steel, since the intrusion of metal ions into the film due to the reaction upon forming the deposited film is prevented, more desirable film having various excellent properties can be obtained with good reproducibility.

It has been also found that as the resistance value of the film to be coated is reduced, the following problems are caused. For instance, when a microwave is charged into the decomposition space (C) for forming the active species, if the inner wall face of the decomposition space (C) is coated with a thin polycrystalline Si film with the resistance value of about $10^3 \Omega.cm$, the microwave is reflected on the thin polycrystalline Si film to reduce the amount of the microwave to be supplied into the decomposition space (C), and because of this, the amount of the active species to be formed therein is decreased and the plasmas caused by the microwave therein become irregular.

Further, it has been found that if the inner wall face of the decomposition space (C) is coated with such a film of which constituent being different from that of a desired deposited film to be formed, the element or ingredient of the coated film is contaminated into the resulting deposited film during its formation, failing to obtain desired property.

From the above, it has been found to be necessary that the film to be coated is constituted with an element or ingredient having a resistance value of $10^6 \Omega.cm$ or more and constituting the deposited film to be formed.

In the process of the present invention, the precursor which is generated in the decomposition-space (B) and introduced into the film-deposition space (A) is such a material having a life span, preferably, of greater than 0.01 sec, more preferably, greater than 0.1 second and, most preferably, greater than 1 second which becomes a main constituent of the deposited film to be formed in the film-deposition space (A). The active species to be used in the present invention is such a material which is generated in the decomposition space (C) and introduced into the film-deposition space (A) at the same time of introducing the precursor from the decomposition space (B) thereinto upon forming a deposited film on a substrate. And the active species is chemically reactive with the precursor. The active species is chemically reacted with the precursor to cause the formation of the deposited film on the substrate in the film-deposition space (A).

The active species to be used in the present invention is such a material that has a life span, preferably, of less than 10 second, more preferably, less than 8 second and, most preferably, less than 5 second.

According to the present invention, more stable CVD process can be attained by properly controlling the atmospheric temperature in the film-deposition space (A) and the substrate temperature as desired.

The process according to the present invention is different from the conventional CVD process in that an active species previously generated in a space different from a film-deposition space. This can remarkably increase the depositing rate as compared with the conventional CVD process and, in addition, it is possible to further lower the substrate temperature upon forming the deposited film, thereby enabling to industrially mass-produce a deposited film of stable film quality at a reduced cost.

In the present invention, the precursor is formed by subjecting a precursor-generating gaseous raw material to the action of a decomposition energy of electric discharge, heat, light etc. in the decomposition space (B). Alternatively, the precursor may be formed by contacting the gaseous raw material with a catalyst. Likewise, the active species is formed from an active species-generating gaseous raw material in the decomposition space (C).

As the precursor-generating raw material to be introduced into the decomposition space (B), there may be used those compounds in which highly electron attractive atoms, atom groups or polar groups being bonded to carbon atoms, silicon atoms or germanium atoms. Examples of such compounds are: compounds represented by the formula: $Y_nX_{2n+2}$ (n=1,2,3,—, X=F, Cl, Br or I, Y=C, Si or Ge): compounds represented by the formula: $(YX_2)_n$ (n≧3, X=F, Cl, Br or I, Y=C, Si or Ge): compounds represented by the formula: $Y_nHX_{2n+1}$ (n=1,2,3,—, X=F, Cl, Br or I, Y=C, Si or Ge): and compounds represented by the formula: $Y_nH_2X_{2n}$ (n=1,2,3,—, X=F, Cl, Br or I, Y=C, Si or Ge).

Specifically, there can be mentioned those gaseous or easily gasifiable compounds for example: $CF_4$, $C_2F_6$, $SiF_4$, $(SiF_2)_5$, $(SiF_2)_6$, $(SiF_2)_4$, $Si_2F_6$, $Si_2H_3F_3$, $SiHF_3$, $SiH_2F_2$, $SiCl_4$, $(SiCl_2)_5$, $SiBr_4$, $(SiBr_2)_5$, $GeF_4$, $Ge_2F_6$.

Further $SiH_2(C_6H_5)_2$, $SiH_2(CH)_2$, etc. may also be used depending on the purpose of using the deposited film to be formed.

These compounds in gaseous state may be diluted with He, Ar or like other gas.

In the present invention, using the precursor having a life span of more than 0.01 sec., the formation of a desired deposited film can be attained by promoting the deposition efficiency and the increase in the deposition rate, wherein the reaction of the precursor with the active species in the film-depositing space (A) is enhanced. In the present invention, it is possible to apply heat or like other energy in the film-deposition space (A) or on the substrate without using electric discharge energy such as plasmas upon forming the deposited film.

In the present invention, as the active species generating raw material to be introduced into the decomposition space (C) for forming the active species, there can be mentioned those gaseous or easily gasifiable compounds such as $H_2$, $SiH_4$, $Si_2H_6$, $SiH_3F$, $SiH_3Cl$, $SiH_3Br$ and $SiH_3I$. These compounds may be diluted with He, Ar or like other gas.

The ratio of the amount of the precursor to the amount of the active specifies to be introduced into the depositing space (A) in the present invention is properly determined depending on the film-forming conditions, the kind of the active species to be used, etc. However, in general, it is preferably from 10:1 to 1:10, more preferably, from 8:2 to 4:6 in terms of the flow ratio.

In the present invention, the precursor to be formed in the decomposition space (B) and the active species to be formed in the decomposition space (C) are not restricted only to one kind but several kinds may be used. The object of the present invention can be attained effectively also in the case where there are used several kinds not only for the precursor but also for the active species.

Further, the deposited film formed by the process according to the present invention may be doped with an impurity element during or after the film formation. For the impurity to be doped, there can be mentioned suitably those elements belonging to the group III of the periodical table, for example, B, Al, Ga, In and Tl for the P-type impurity, while those elements belonging to Va of the periodical table, for example, N, P, As, Sb and Bi for the N-type impurity. Among them, B, Ga, P and Sb are most preferred. The amount of the impurity to be doped is properly determined depending on desired electrical and optical properties.

As the material capable of supplying the impurity, those compounds which are gaseous at normal temperature and normal pressure or those compounds which are easily gasifiable at least under the film-forming conditions are used. As such compounds, there can be mentioned, specifically, $PH_3$, $P_2H_4$, $PF_3$, $PF_5$, $PCl_3$, $AsH_3$, $AsF_3$, $AsF_5$, $AsCl_3$, $SbH_3$, $SbF_5$, $BiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, etc.

These compounds may be used alone or two or more of them may be used in combination.

The compound capable of supplying the impurity may be introduced into the film-deposition space (A) directly in a gaseous state, or after in admixture with a compound containing silicon and halogen. Alternatively, the compound may be activated in the decomposition space (C) and then introduced into the film-deposition space (A). In this case, the selected compound capable of supplying the impurity is activated with the action of an energy of electric discharge, heat, light or like other energy. The active species formed by activating the compound capable of supplying the impurity is introduced into the filmdeposition space (A) after being previously mixed with the active species or independently.

The substrate on which a deposited film is to be formed may be electroconductive or electrically insulating. As the electroconductive substrate, there can be mentioned, for example, those metals such as NiCr, stainless steel, Al, Cr, Mo, Au, Ir, Nb, Ta, V, Ti, Pt, Pd, etc. or alloys thereof.

As the electrically insulating substrate, films or sheets of synthetic resins such as polyester, polyethylene, polycarbonate, cellulose acetate, polypropylene, polyvinyl chloride, polyvinylidene chloride, polystyrene or polyamide, glass, ceramics, paper, etc. are used usually. These electrically insulating supports may be preferably applied with electroconductive treatment to at least one surface thereof and the deposited film is desirably disposed on the surface applied with the electroconductive treatment.

For instance, in the case of a glass substrate, the surface is applied with electroconductive treatment by disposing a thin film made of NiCr, Al, Cr, Mo, Au, Ir, Nb, Ta, V, Ti, Pt, Pd, $In_2O_3$, $SnO_2$, $ITO(In_2O_3+SnO_2)$, etc. In the case of synthetic films such as polyester film, they are treated with vacuum deposition, electron beam deposition, sputtering, etc. with metals such as NiCr, Al, Ag, Pb, Zn, Ni, Au, Cr, Mo, Ir, Nb, Ta, V, Ti, Pt, etc. or applied with lamination using the above-mentioned metal, thereby applying electroconductive treatment to the surface thereof.

In the present invention, the thickness of the film to be coated on the inner wall face of the chamber constituting the film-deposition space (A) and on the inner wall face of the chamber constituting decomposition space (C) is, preferably, from 100 Å to 3 μm and, more preferably, from 1000 Å to 1 μm.

In the present invention, the space left unoccupied by a substrate or a substrate support bed is desired to be also coated with the film in addition to the inner wall face of the decomposition space (C) and the inner wall face of the film-deposition space (A).

In order to coat the inner wall face of the decomposition space (C) with the film, an appropriate method may be employed. For example, the film-forming process for forming a deposited film using the foregoing precursor and the foregoing active species in the present invention may be employed. In this case, when said filmforming process is carried out while maintaining the inner pressure of the film-deposition space (A) at a pressure of about 0.5 Torr or more, the precursor formed in the decomposition space (B) is diffused also into the decomposition space (C) and it chemically reacts with the active species formed there to cause the deposition of a film to coat the inner wall face of the decomposition space (C) in addition causing the deposition of a film to coat not only the inner wall face of the film-deposition space (A) but also the foregoing space of the substrate support bed.

Other than this, the inner wall face of the decomposition space (C) and the inner wall face of the filmdeposition space (A) may be constituted by a member previously coated with a film having a resistance value of $10^6 \Omega \cdot cm$ or more which is constituted with constituents of a deposited film to be formed. In a preferred embodiment in this case, both the chamber constituting the decomposition space (C) and the chamber constituting the film-deposition space (A) are made using a member one surface of which to be their inner wall being previously applied with coating treatment with the element or ingredient which constitutes a deposited film to be formed. In order to carry out said coating treatment for the surface of the member, any of the following methods may be employed.

That is, there is a method of coating a member using an apparatus different from that used for the deposition of a film. For instance, the member is disposed to the inside of the apparatus usually employed for vapor deposition or sputtering and coating is applied to a desired portion of the member as the deposited film of a desired thickness by vapor deposition or sputtering using the element for constituting the deposited film as a vapor deposition source or sputtering target. The film thickness is preferably, from 1000 Å to 3 μm and, more preferably, from 1000 Å to 1 μm as described above. Other than this method, it is possible to employ another method of depositing a film by introducing the foregoing precursor and the foregoing active species into the film-deposition space where the member being placed and carrying out the film-forming process according to the present invention to thereby coat the member with a deposited film. Also in this case, the film is deposited to a thickness, preferably, from 100 Å 3 μm and, more preferably, from 1000 Å to 1 μm.

Figure 7:
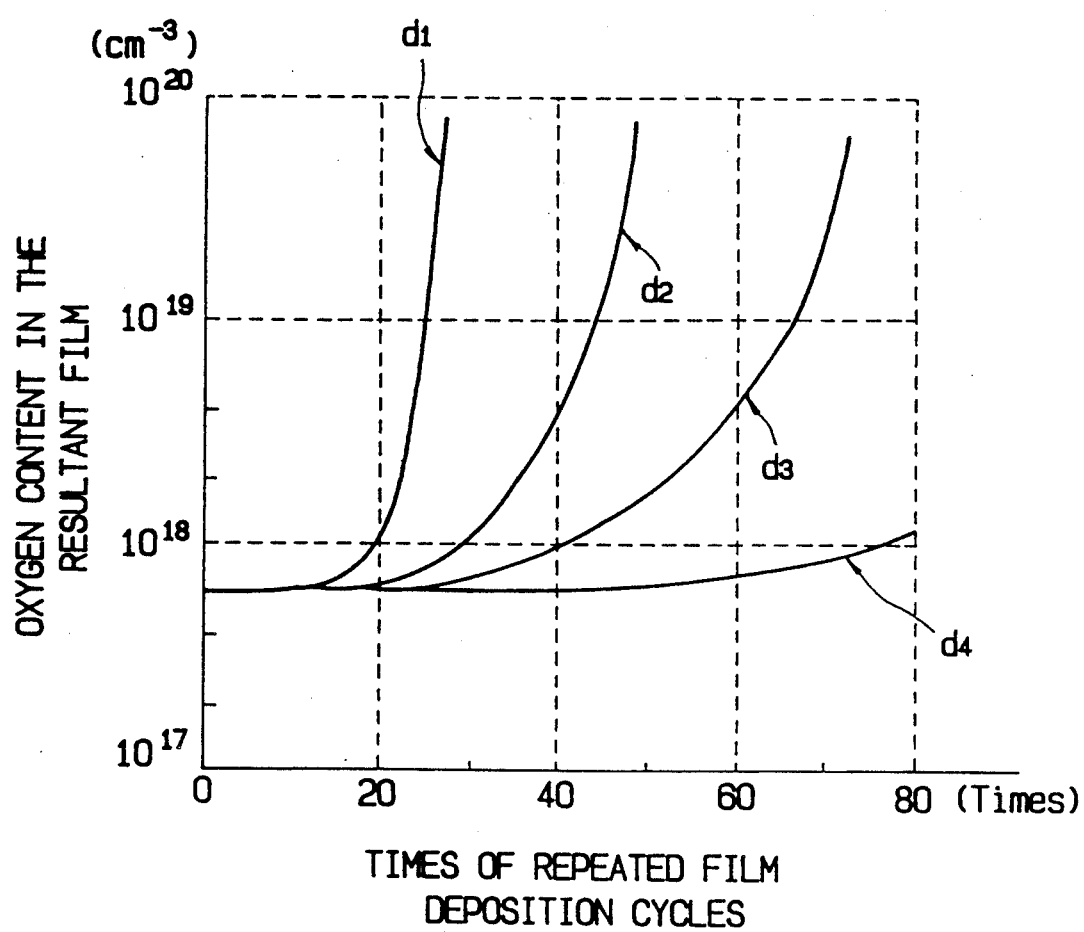
FIG. 7 is a graph showing a relationship between the number of repeating deposition and the concentration of oxygen (O) in the deposited film as the result of experiment.

Referring to the range of the selected film thickness, the coated film is scraped off during repeating formation of a deposited film on a substrate to expose the original inner wall face of the film-depositing space (A) and that of the decomposition space (C), in the case where the thickness is insufficient, thereby causing contamination of the wall face material into the resulting film. On the other hand, in the case where the coated film is excessively thick, distortion is caused in the coated film to bring about film peeling in the coating member on the inner wall surface during deposition or upon vacuum breaking after deposition. Accordingly, contaminants of the wall face material int eh film or peeled film material are deposited on the substrate int he same manner as described above, to cause pin-hole failures. The foregoing has been confirmed by the relationship between the thickness of the coating film on the wall face and the number of film deposition, and the amount of oxygen in $SiO_2$ as the wall face material to be mixed in the film by means of contamination. The results of the experiment were as shown in FIG. 7.

That is, four non-doped a -Si(H,F) films $d_2$—$d_4$ with varied film thickness were prepared as the films for coating the inner wall surface of the chambers for constituting the depositing space (A) and the decomposing space (C) in the same apparatus and by the identical method as those in EXAMPLE 1 described later. Subsequently, films each of 1 μm thickness were deposited under the same conditions as those in Example 1. When the deposition was conducted while varying the number of repeating deposition respectively up to 80 times, it has been found that the oxygen concentration introduced into the film was greatly varied as shown in FIG. 7. The film thickness was: $d_1 = 100$ Å, $d_2 = 1000$ Å, $d_3 = 1$ μm and $d_4 = 3$ μm. It has been found that the oxygen concentration in the film showed no substantial change even for the repeating deposition for more than 50 times in the case of $d_4$.

PREFERRED EMBODIMENT OF THE INVENTION

Explanation is to be made for the capability of forming desired deposited films by practicing the process according to the present invention. It should, however, been noted that the present invention is not restricted only to these examples.

FIG. 1 is a schematic view illustrating a typical example of a deposited film forming apparatus suitable to practicing the process for the formation of the deposited film according to the present invention.

In the drawing, a deposition film-forming substrate 103 is placed on a substrate support bed 102 at the inside of a deposition chamber 101 as a film-forming space. There are also shown a heater 104 for heating the substrate and gas supply sources 105 through 108 and 112 which are disposed depending on the kinds of the starting material gases used for film-formation, inert gases used as required and gases of compounds containing impurity element as the ingredient. In the case of using those gases which are liquid at normal state, an appropriate gasifying device is provided. For the gas supply sources 105 through 108 and 112 in the drawing, there are also shown pressure controllers 105a through 108a and 112a for the starting material gas, valves 105b and 105 c through 108b and 108c and 112b and 112 c for flowing respective gases and mass flow controllers 105d through 108d and 112d for controlling the flow rate of the starting material gases. A microwave power source 110 that generates an activation energy for forming an active species is disposed around the decomposition space (C) for forming the active species, and microwave is introduced by way of a waveguide 111 into the decomposition space (C). The starting material gas for forming the active species supplied from the gas introduction pipe 109 is activated in the decomposition space (C) and the resultant active species is introduced into the deposition chamber 101.

Starting material gas for forming the precursor supplied from a gas introduction pipe 113 is converted into a precursor by heat energy supplied from an electrical furnace 114 in the decomposition space (B), and the resultant precursor is introduced into the deposition chamber 101, where it is chemically reacted with the active species to form a deposited film on the substrate 103. In the drawing, are also shown an exhaustion valve 115, an exhaustion pipe 116, and a quartz pipe 121 previously coated at the inner surface thereof with a thin Si film to about 1 μm thickness.

Figure 2:
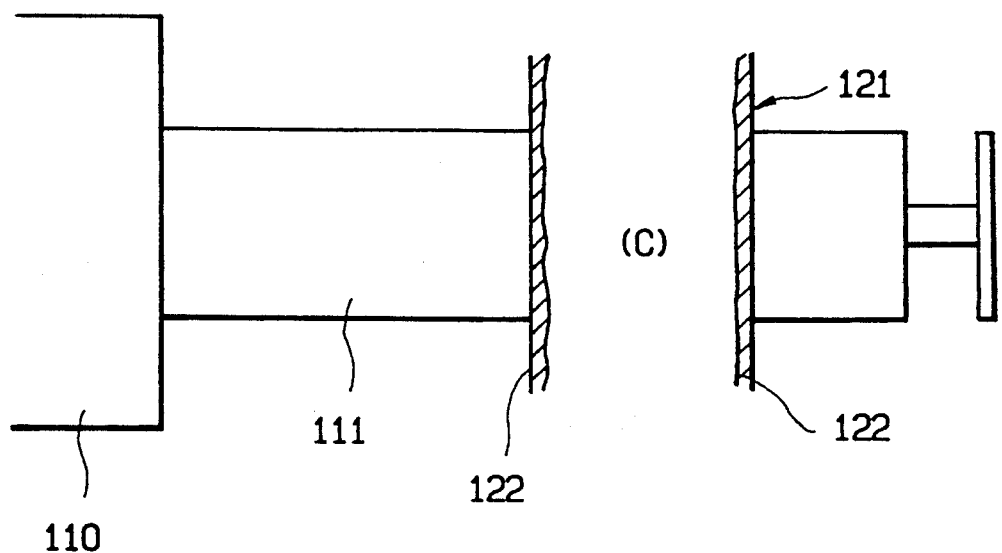
FIG. 2 is a schematic view illustrating a state in which the inner surface of the wall of the decomposition chamber (C) of the apparatus shown in FIG. 1 is coated with a predetermined film.
Figure 3:
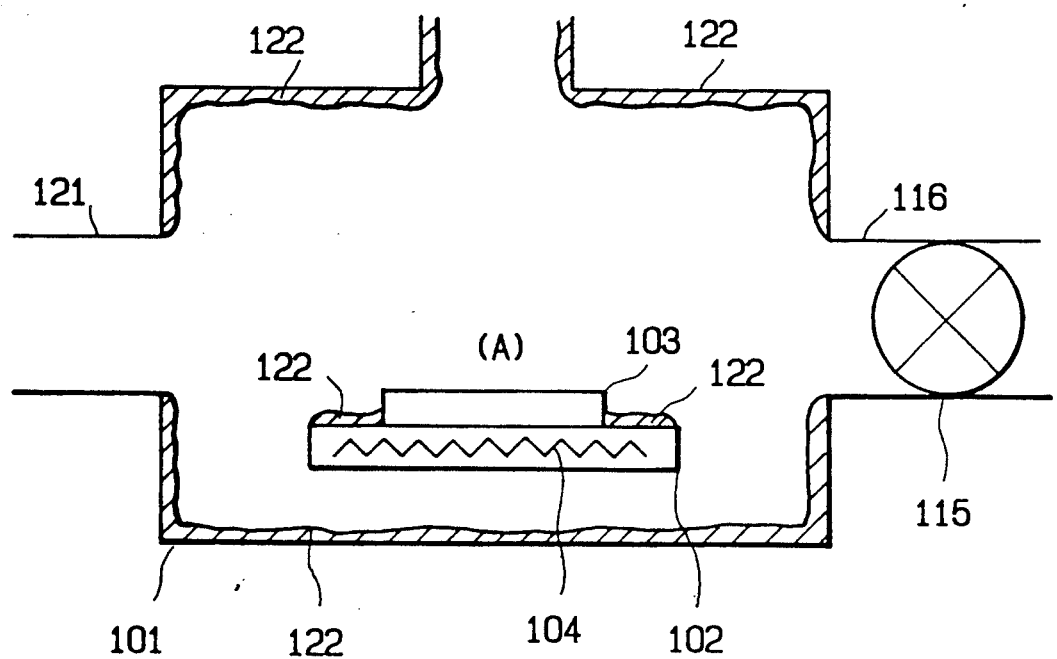
FIG. 3 is a schematic view illustrating a state in which the inner surface of the wall of the film-deposition chamber (A) of the apparatus shown in FIG. 1 is coated with a predetermined film.

FIGS. 2 and 3 are respectively, schematic views showing that a thin film is coated on the inner wall of the chambers for the decomposition space (C) and the film-deposition space (A), in which 122 represents a coated film.

Figure 4:
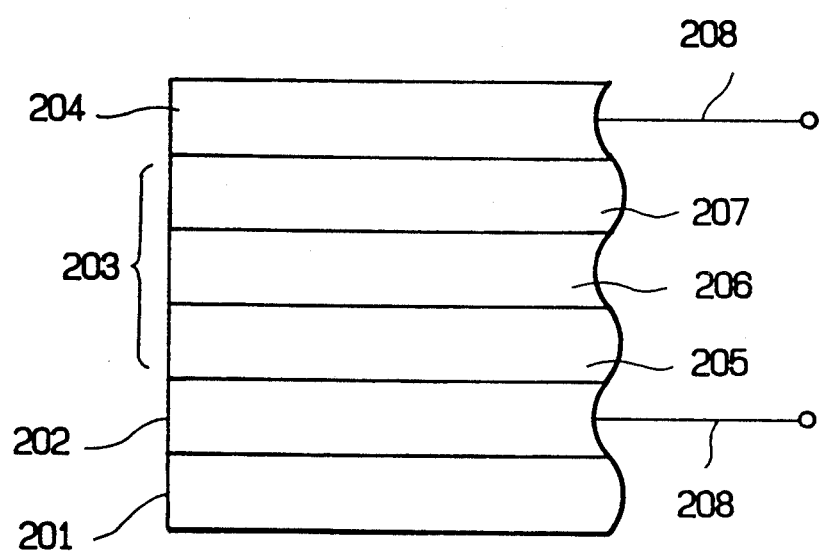
FIG. 4 is a schematic explanatory view of a PIN type diode prepared by the process according to the present invention.

FIG. 4 is a schematic view showing a typical example of a PIN type diode device formed by utilizing an amorphous Si deposited film doped with an impurity element, which is manufactured by practicing the process according to the present invention.

In the drawing, there are shown a substrate 201, thin film electrodes 202, 204 and a semiconductor layer 203 which is constituted with an N-type semiconductor layer 205, an I-type semiconductor layer 206 and a P-type semiconductor layer 207. A conduction wire 208 is connected with an external electric circuit device now shown.

The thin film electrodes 202 and 204 are obtained, for example, by disposing thin films made of NiCr, Al, Cr, Mo, Au, Ir, Nb, Ta, V, Ti, Pt, Pd, $In_2O_3$, $SnO_2$, ITO ($In_2O_3 + SnO_2$), etc. to the substrate 201 and the semiconductor layer 203 by means of vapor deposition, electron beam deposition, sputtering or like other treatment. The film thickness of the electrodes 202, 204 is, preferably, from 30 to $5 \times 10^4$Å, more preferably, from 10 to $5 \times 10^3$Å.

The film constituting the semiconductor layer 203 comprising a-Si(H,X) is formed, as required, into the N-type or P-type by doping N-type and/or P-type impurity among impurity elements into the layer to be formed while controlling the amount thereof upon forming the layer.

For forming the N-type or P-type a-Si(H,X) layer, a precursor containing silicon and halogen is introduced into the film-deposition space (A). Alternatively, film-forming chemical substance separatedly introduced into the decomposition space (C) and, as required, inert gas and gases of compounds containing impurity elements as the ingredients are excited and decomposed by means of activation energy respectively, thereby forming respective active species, which are introduced separately or after properly mixed with each other into the film-deposition space (A) by which the active species and the precursor containing silicon and halogen are brought into chemical reaction with each other to form a deposited film on the substrate 201.

EXAMPLE 1

P-type and N-type amorphous Si(H,F) films were formed by the following procedures using the deposited film forming apparatus shown in FIG. 1.

At first, after placing a #7059 glass substrate (a) (product of Corning Glass Works) from a load lock chamber (not illustrated) by way of a gate valve (not illustrated) onto a substrate support bed 102, the inside of the deposition chamber 101 was evacuated to about $10^{-6}$ Torr using a rotary pump, a mechanical booster pump and a turbo molecular pump by way of an exhaustion pipe 116. Then, the surface of the quartz pipe 121 was heated to 700° C. by the electric furnace 114, while the surface of the substrate was heated to 250° C. by a heating heater 104 respectively and the temperature were maintained. Then, there were introduced H$_2$ gas at 30 sccm from the gas reservoir 105, Ar gas at 150 sccm from the gas reservoir 106 and BF$_3$ diluted with Ar to 300 ppm at 10 sccm from the gas reservoir 107, the pressure in the deposition chamber was maintained at 1 Torr by controlling the opening degree of the exhaustion valve 115 and microwave at an effective power of 200 W was generated from the microwave power source 110. Then, H radicals as the active species formed in the decomposition space (C) were introduced into the film-deposition space (A).

Successively, Si$_2$F$_6$ gas was introduced at 30 sccm from the gas reservoir 112 into the quartz pipe 121, while the SiF$_2$ radicals as the precursor formed in the decomposition space (B) were introduced into the film-deposition space (A).

Then, the inner walls of the chambers constituting the decomposition space (C) and the film-deposition space (A) were coated with P-type a-Si(H,F) films of 5000 Å thickness.

Then, after turning OFF the microwave power source, the entrance valves for the gases used were closed to evacuate the inside of the deposition chamber to 10$^{-6}$ Torr. Subsequently, the substrate (a) was taken out of the system.

Then, a #7059 glass substrate (b) (76.2 mm length, 25.4 mm width, 0.8 mm thickness) was introduced from the load lock chamber by way of the gate valve to the inside of the deposition chamber 101 and placed on the substrate support bed 102. Then, it was confirmed that the temperature at the substrate and the surface temperature of the quartz pipe 121 were kept to 250° C. and 700° C. respectively. Then, P-type a-Si(H,F) film was deposited to a thickness of 1 μm on the #7059 glass substrate (b) under the same conditions as those in the formation of the coating film, that is, under identical gas flow rate, microwave power and electric furnace temperature, while applying a pressure of 0.1 Torr to the inside of the deposition chamber and depositing the P-type a-Si(H,F) film to a thickness of about 1 μm on the #7059 glass substrate (b).

Alternatively, after coating the inner wall of the chamber constituting the decomposition space (C) and the film-deposition space (A) with an N-type a-Si(H,F) film to a thickness of 5000 Å under the same conditions as those in coating and depositing the P-type a-Si(H,F) film described above except for not using BF$_3$/Ar gas from the gas reservoir 107 but introducing PH$_3$ diluted with Ar to 300 ppm at 10 sccm from the gas reservoir 108, an N-type A-Si(H,F) film was deposited to a film thickness of 1 μm on a separate substrate.

The formation of the P-type and N-type A-Si(H,F) films were conducted each for 20 times, to measure the photoconductivity ($\sigma p$:S/cm), dark conductivity ($\sigma d$:S/cm) and optical band gap (Eg$^{opt}$). For the value of the ratio between $\sigma p$ and $\sigma d$ ($\sigma p/\sigma d$) and the value for Eg$^{opt}$, average values were determined for the respective 20 samples and the results are shown in Table 1.

Further, for the respective 20 samples, the value for the total of the numbers of samples having $\sigma p/\sigma d$ of greater than 10$^{5.0}$ and Eg$^{opt}$ within a range from 1.65 to 1.70 (eV), the total number was 1.2 for the P-type a- Si(H,F) film and 1.3 for the N-type a-Si(H,F) film, as compared with the value "1" assumed for the Comparative Example described later.

Further, when the resistance value ($\sigma$) of the deposited film on the substrate (a) placed in the deposition chamber upon forming the deposited film as described above was measured, it was 10$^{7.3}$ Ω.cm for the P-type a-Si(H,F) film and 10$^{7.4}$ Ω.cm for the N-type a-Si(H,F) film.

From the foregoings, it has been found that a great number of deposited films of more excellent property than conventional ones can be obtained by applying coating having the ingredient constituting the deposited film with resistance value of 10$^6$Ω.cm or more.

COMPARATIVE EXAMPLE

Figure 5:
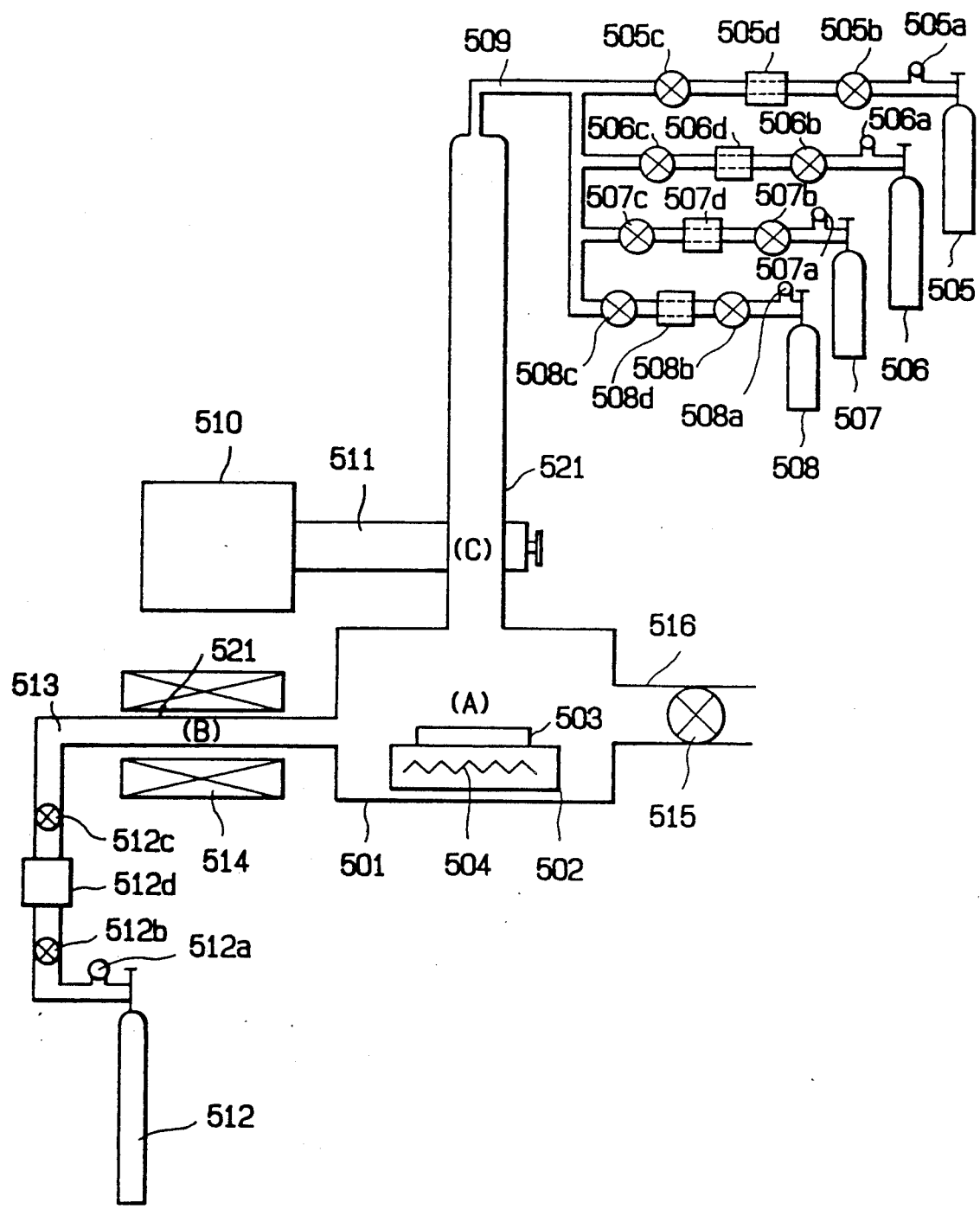
FIG. 5 is a schematic explanatory view of a typical apparatus which is suitably used for practicing the conventional process for the formation of a deposited film.

Using the conventional deposited film forming apparatus shown in FIG. 5, 20 specimens were prepared in which P-type and N-type a-Si(H,F) films were deposited on the substrate by the same conditions and the procedures as those in Example 1 except for not coating the inner wall of the chamber constituting the decomposition space (C) and the film-deposition space (A) with the film, and the same measurement as in Example 1 was conducted. In this case, for the respective 20 samples, the value for the total of the numbers of samples having a $\sigma p/\sigma d$ of greater than 10$^{5.0}$ and Eg$^{opt}$ within a range from 1.65 to 1.70 eV was assumed to be "1", which was used as the evaluation or reference for the samples prepared in Examples 1 and 3.

EXAMPLE 2

Using the deposited film forming apparatus shown in FIG. 1, a PIN type diode shown in FIG. 4 was prepared.

At first, in the same procedures as those in Example 1, after coating an N-type a-Si(H,F) film having resistance value of 10$^{7.4}$ (Ω.cm) to the inner wall of the decomposition space (C) and the film-deposition space (A) to a thickness of 100 Å a polyethylene phthalate film 201 vapor-deposited with an ITO film 202 with 500 Å thickness was placed on the substrate support bed 102 and an N-type A-Si(H,F) film 205 was formed in the same manner as in Example 1 on the ITO film 202 to a thickness of 1000 Å.

Subsequently, the microwave power source and the flow of the gas were once turned OFF, the inside of the deposition chamber 101 was evacuated to 10$^{-6}$ Torr and the substrate 201 was transferred to the load lock chamber not illustrated. Then, in the same procedures as those in Example 1, a non-doped a-Si(H,F) film with resistance value of 10$^{7.0}$ Ω.cm was coated to the inner walls of the chambers constituting the decomposition space (C) and the film-deposition space (A) to a thickness of 100 Å in the same procedures as those in Example 1 except for not introducing PH$_3$ diluted with Ar to 300 ppm from the gas supply source 103. Then, after once turning OFF the microwave power source and the gas flow, and evacuating the inside of the depositing chamber 101 to 10$^{-6}$ Torr, the substrate 201 was again transferred into the deposition chamber 101 and placed on the substrate support bed 102.

Subsequently, a non-doped a-Si(H,F) film 206 was deposited to a thickness of 1000 Å on an N-type a-Si(H,F) film 205 under the same conditions as described above.

Then, in the same procedures as in Example 1 and as described above, after coating a P-type a-Si(H,F) film having a resistance value of $10^{7.3}\Omega\cdot\text{cm}$ to a thickness of 100 Å, a P-type a-Si(H,F) film 207 was formed to a thickness of 1000 Å on the non-doped a-Si(H,F) film 206.

Further, an Al electrode 204 of 500 Å film thickness was vapor-deposited on the P-type a-Si(H,F) film 307 by way of a vacuum deposition device (not illustrated), to obtain a PIN type diode.

I-V characteristics of the thus obtained PIN type diode device (1 cm² area) were measured to evaluate the rectifying property. As a result, the rectifying ratio of the diode at a voltage of 1 V showed satisfactory value of $8\times 10^5$ and n value of the diode was 1.20.

EXAMPLE 3

Using the deposited film forming apparatus shown in FIG. 1, P-type and N-type a-Si(H,F) films were formed each by 20 samples. In this case, the respective 20 samples were prepared under the same procedures and the conditions as those in Example 1 except for changing the resistance value of the films coated to the inner walls of the chambers constituting the decomposition space (C) and the film-deposition space (A) to various values as shown in Table 2. The resultant specimens were measured and evaluated in the same way as in Example 1. The results are shown in Table 2. It can be seen from Table 2 that a great number of deposited films of more excellent characteristics than those by the conventional methods can be obtained in each of the cases.

EXAMPLE 4

20 specimens of P-type a-Si(H,F) films were prepared by using the deposited film forming apparatus as shown in FIG. 1 and by the same procedures as those in Example 1, by constituting the decomposition space (C) with a member prepared by coating the inner wall of a cylindrical quartz glass (SiO₂) tube with a P-type a-Si(H,F) film having resistance value of $10^{10.0}$ $\Omega\cdot\text{cm}$ to a thickness of 7000 Å and constituting the deposition chamber with an Al cylindrical member coated at the inner wall surface thereof with a P-type a-Si(H,F) film having resistance value of $10^{10.0}\Omega\cdot\text{cm}$ to a thickness of 7000 Å (the step of forming the deposited film was not conducted in this case). The thus obtained 20 specimens were measured and evaluated in the same way as in Example 1. Satisfactory results were obtained for the average value of $\sigma p/\sigma d$ as $10^{5.5}$ and average value for $Eg^{opt}$ as 1.68 eV. Further, the relative ratio of the number of samples having $\sigma p/\sigma d$ of greater than $10^{10.0}$ and $Eg^{opt}$ within a range from 1.65 to 1.70 eV to that of the Comparative Example was 1.5.

TABLE 1

| | Sample | |
|---|---|---|
| Measuring item | P-type a-Si (H,F) | N-type a-Si (H,F) |
| $\sigma p/\sigma d$ (average value) | $10^{5.3}$ | $10^{5.2}$ |
| $Eg^{opt}$ (average value) | 1.69 eV | 1.66 eV |

TABLE 2

| Sample No. | 2001~2040 | 2041~2080 | 2081~2120 | 2121~2160 | 2161~2200 |
|---|---|---|---|---|---|
| Resistance value of coating film ($\Omega\cdot\text{cm}$) | $10^{8.5}$ | $10^{9.2}$ | $10^{11.3}$ | $10^{6.0}$ | $10^{13.0}$ |
| P-type a-Si (H,F) film | | | | | |
| $\sigma d/\sigma p$ (average value) | $10^{5.2}$ | $10^{5.1}$ | $10^{5.0}$ | $10^{5.0}$ | $10^{5.1}$ |
| $Eg^{opt}$ (average value) | 1.67 | 1.68 | 1.70 | 1.70 | 1.69 |
| the ratio of numbers of samples with $\sigma d/\sigma p$ of more than $10^{5.0}$ and $Eg^{opt}$ from 1.65 to 1.70 eV to that of Comparative Example | 1.3 | 1.3 | 1.2 | 1.2 | 1.3 |
| N-type a-Si (H,F) film | | | | | |
| $\sigma d/\sigma p$ (average value) | $10^{5.2}$ | $10^{5.1}$ | $10^{5.0}$ | $10^{5.0}$ | $10^{5.1}$ |
| $Eg^{opt}$ (average value) | 1.67 | 1.68 | 1.70 | 1.70 | 1.69 |
| the ratio of numbers of samples with $\sigma d/\sigma p$ of more than $10^{5.0}$ and $Eg^{opt}$ from 1.65 to 1.70 eV to that of Comparative Example | 1.2 | 1.3 | 1.2 | 1.3 | 1.3 |

What is claimed is:

1. A process for forming a functional deposited film on a substrate in a three-chambered chemical vapor deposition apparatus comprising a first deposition chamber (B) having a decomposition space (b) for generating a precursor capable of contributing to the formation of said deposited film, a second decomposition chamber (C) having a decomposition space (c) for generating a hydrogen-containing active species which is chemically reactive with said precursor, and a film deposition chamber (A) having a film deposition space (a) for chemically reacting said precursor with said active species to form a deposited film on a heated substrate, wherein both of said decomposition spaces (b) and (c) are respectively connected through their downstream regions to said film deposition space (a) said process comprising the steps of:

- introducing a precursor-generating raw material gas into said decomposition space (b) and energizing an activation energy applying means connected to said decomposition chamber (B) in order to apply an activation energy into said decomposition space (b), thereby generating said precursor;
- introducing an active species generating raw material gas into said decomposition space (c) and energizing a microwave energy applying means connected to said decomposition chamber (C) in order to apply a microwave energy into said decomposition space (c), thereby generating said hydrogen-containing active species;
- separately introducing said precursor and said hydrogen-containing active species into said film deposition space (a) and chemically reacting them to form said deposited film on said substrate;
- coating the inner wall of said decomposition chamber (C) with a thin film comprising an element constituting a deposited film to be formed on the substrate and having a resistance value of at least $10^6$ $\Omega\cdot\text{cm}$, wherein said film coating encloses the deposition space (c); and coating the inner wall of said film deposition chamber (A), with said thin film which comprises said element constituting the deposited film to be formed on the substrate having a resistance value of at least $10^6$ $\Omega$.cm, said thin film enclosing said film deposition space (a) containing said substrate holder and said substrate.

2. The process according to claim 1, wherein said inner wall of the decomposition chamber (C) and said inner wall of the film deposition chamber (A) are each previously coated with an element constituting the deposited film to be formed having a resistance value of at least $10^6$ $\Omega$.cm before said precursor and hydrogen-containing active species are introduced into film deposition space (a).

* * * * *

UNITED STATES PATENT AND TRADEMARK OFFICE
CERTIFICATE OF CORRECTION

PATENT NO. : 5,002,793

DATED : March 26, 1991

INVENTOR(S) : TAKAYOSHI ARAI

It is certified that error appears in the above-identified patent and that said Letters Patent is hereby corrected as shown below:

ON THE TITLE PAGE,

IN [54] TITLE

"AT LEAST $10^6 \Omega$ CM" should read --AT LEAST $10^6 \Omega \cdot$CM--.

IN [57] ABSTRACT

Line 6, "in to" should read --into--.
    Line 7, "a decomposition space" should read
        --in a decomposition space--.

COLUMN 1

Line 5, "AT LEAST $10^6 \Omega$ CM" should read
        --AT LEAST $10^6 \Omega \cdot$CM--.
    Line 33, "homogenity" should read --homogeneity--.
    Line 60, "homogenity" should read --homogeneity--.
    Line 61, "homogenity" should read --homogeneity--.

COLUMN 2

Line 45, "qualitY" should read --quality--.

COLUMN 3

Line 10, "contaminates" should read --contaminants--.

COLUMN 5

Line 36, "decomposition-space (B)" should read
        --decomposition (B)--.

UNITED STATES PATENT AND TRADEMARK OFFICE
CERTIFICATE OF CORRECTION

PATENT NO. : 5,002,793

DATED : March 26, 1991

INVENTOR(S) : TAKAYOSHI ARAI

It is certified that error appears in the above-identified patent and that said Letters Patent is hereby corrected as shown below:

COLUMN 6

Line 31, "$SiH_2(CH)_2$" should read --$SiH_2(CN)_2$--.
    Lines 47-48, "speciesgenerating" should read
        --species-generating--.

COLUMN 7

Line 35, "filmdeposition" should read --film-deposition--.

COLUMN 8

Line 14, "filmforming" should read --film-forming--.
    Lines 26-27, "filmdeposition" should read
        --film-deposition--.
    Line 49, "1000 Å" should read --100 Å--.
    Line 58, "100 Å 3 µm" should read --100 Å to 3 µm--.

COLUMN 9

Line 4, "int eh" should read --in the--.
    Line 5, "int he" should read --in the--.

COLUMN 10

Line 12, "are respectively," should read
        --are, respectively,--.
    Line 28, "now shown" should read --not shown--.
    Line 47, "separatedly" should read --separately--.

COLUMN 12

Line 33, "film forming" should read --film-forming--.

UNITED STATES PATENT AND TRADEMARK OFFICE
CERTIFICATE OF CORRECTION

PATENT NO. : 5,002,793
DATED : March 26, 1991
INVENTOR(S) : TAKAYOSHI ARAI

It is certified that error appears in the above-identified patent and that said Letters Patent is hereby corrected as shown below:

COLUMN 14

TABLE 1, "$\sigma p/\sigma d$ (average value)   $10^{5.3}$   $10^{5.2}$" should read --$\sigma p/\sigma d$ (average value)   $10^{5.3}$   $10^{5.2}$--.

TABLE 2, "$10^{8.5}$   $10^{9.2}$   $10^{11.3}$   $10^{6.0}$   $10^{13.0}$" should read --$10^{8.5}$   $10^{9.2}$   $10^{11.3}$   $10^{6.0}$   $10^{13.0}$--.

TABLE 2, "$10^{5.2}$   $10^{5.1}$   $10^{5.0}$   $10^{5.0}$   $10^{5.1}$" should read --$10^{5.2}$   $10^{5.1}$   $10^{5.0}$   $10^{5.0}$   $10^{5.1}$-- (both occurrences).

TABLE 2, "$\sigma d/\sigma p$ of more than $10^{5.0}$ and $Eg^{opt}$" should read --$\sigma d/\sigma p$ of more than $10^{5.0}$ and $Eg^{opt}$-- (both (occurrences).

Signed and Sealed this

Seventeenth Day of November, 1992

Attest:

DOUGLAS B. COMER

Attesting Officer     Acting Commissioner of Patents and Trademarks